US010067377B2

(12) United States Patent
Wang et al.

(10) Patent No.: US 10,067,377 B2
(45) Date of Patent: Sep. 4, 2018

(54) ARRAY SUBSTRATE AND METHOD FOR PREPARING THE SAME, AND DISPLAY DEVICE

(71) Applicant: BOE TECHNOLOGY GROUP CO., LTD., Beijing (CN)

(72) Inventors: Xinxing Wang, Beijing (CN); Jaegeon You, Beijing (CN); Jikai Yao, Beijing (CN)

(73) Assignee: BOE TECHNOLOGY GROUP CO., LTD. (CN)

( * ) Notice: Subject to any disclaimer, the term of this patent is extended or adjusted under 35 U.S.C. 154(b) by 562 days.

(21) Appl. No.: 14/381,619

(22) PCT Filed: Nov. 6, 2013

(86) PCT No.: PCT/CN2013/086609
§ 371 (c)(1),
(2) Date: Aug. 28, 2014

(87) PCT Pub. No.: WO2015/014037
PCT Pub. Date: Feb. 5, 2015

(65) Prior Publication Data
US 2016/0238893 A1    Aug. 18, 2016

(30) Foreign Application Priority Data

Jul. 29, 2013   (CN) .......................... 2013 1 0322536

(51) Int. Cl.
*H01L 27/14*   (2006.01)
*G02F 1/1335*   (2006.01)
(Continued)

(52) U.S. Cl.
CPC ...... *G02F 1/133555* (2013.01); *G02F 1/1368* (2013.01); *G02F 1/133345* (2013.01);
(Continued)

(58) Field of Classification Search
CPC ...................................................... H01L 27/14
(Continued)

(56) References Cited

U.S. PATENT DOCUMENTS

| 2006/0139524 | A1* | 6/2006 | Chen ...................... B82Y 20/00 349/114 |
| 2010/0123863 | A1* | 5/2010 | Mori ................. G02F 1/133555 349/114 |
| 2015/0177565 | A1* | 6/2015 | Wang ................. G02F 1/133504 349/106 |

FOREIGN PATENT DOCUMENTS

| CN | 1953187 A | 4/2007 |
| CN | 101840103 | 9/2010 |

(Continued)

OTHER PUBLICATIONS

Office Action in Chinese Patent Application No. 201310322536.0, dated Feb. 15, 2016.
(Continued)

*Primary Examiner* — Marvin Payen
(74) *Attorney, Agent, or Firm* — Brooks Kushman P.C.

(57) ABSTRACT

The present invention discloses an array substrate and a method for preparing the same, and a display device. The array substrate comprises a substrate, and a thin-film transistor and a passivation layer formed on a side of the substrate, and the array substrate is divided into a reflective region and a transmissive region, wherein an insulating layer is formed on the reflective region on a side of the passivation layer that is far from the substrate, and a nanoparticle layer for diffuse reflecting an incident light is formed on a side of the insulating layer that is far from the substrate. Not only the viewing angle of the array substrate is enlarged, but also the performances of the array substrate such as transmittance, contrast and dark-state uniformity are guaranteed,
(Continued)

thus the present invention is especially applicable for display devices for large-scale outdoor display.

12 Claims, 3 Drawing Sheets

(51) Int. Cl.
*G02F 1/1333* (2006.01)
*G02F 1/1368* (2006.01)
*H01L 21/027* (2006.01)
*H01L 27/12* (2006.01)

(52) U.S. Cl.
CPC .... *G02F 1/133504* (2013.01); *H01L 21/0274* (2013.01); *H01L 27/1214* (2013.01); *H01L 27/1288* (2013.01)

(58) Field of Classification Search
USPC .............................................. 257/72, 98–100
See application file for complete search history.

(56) References Cited

FOREIGN PATENT DOCUMENTS

| | | |
|---|---|---|
| CN | 101916006 A | 12/2010 |
| CN | 202141872 | 2/2012 |
| CN | 102650780 | 8/2012 |
| CN | 103018951 | 4/2013 |
| JP | 2003262857 | 9/2003 |

OTHER PUBLICATIONS

Text of the Notification of the First Office Action issued in corresponding Chinese Application No. 2013103225360 dated Apr. 21, 2015.

International Search Report and Written Opinion issued in corresponding International Application No. PCT/CN2013/086609 dated Apr. 22, 2014.

Office Action in Chinese Patent Application No. 201310322536.0, dated Aug. 21, 2015.

\* cited by examiner

ARRAY SUBSTRATE AND METHOD FOR PREPARING THE SAME, AND DISPLAY DEVICE

CROSS REFERENCE TO RELATED APPLICATION

This application is the U.S. national phase of PCT Application No. ACT/CN2013/086609 filed on Nov. 16, 2013, which claims priority to Chinese Patent Application No. 201310322536.0 filed on Jul. 29, 2013, the disclosures of which are incorporated in their entirety by reference herein.

TECHNICAL FIELD

The present invention relates to the field of display technologies, and in particular, to an array substrate and a method for preparing the same, and a display device.

BACKGROUND

With the development of display technologies, outdoor display devices are no longer limited to small-scale mobile phone, tablet computer or portable computer, etc. For some large-scale products, for example, plaza TV, open-air theater and large billboard, requirement on outdoor visibility becomes higher. The existing technology for improving outdoor visibility is the semi-transflection technology. In other words, requirement on semi-transflection technology becomes higher.

For large-scale semi-transflection technology, it is required that the viewing angle should be larger than 30°. Therefore, the single mirror reflection mode applied to small-scale products will no longer be applicable, and the viewing angle must be enlarged.

A method for enlarging the viewing angle is disclosed in the prior art, wherein the surface of a reflective layer is processed via mechanical friction or an etching process to form an uneven surface, such an uneven surface may act as a diffuse reflective surface and the region that a light may reach may be enlarged, so that the viewing angle may be enlarged. However, the mechanical friction or the etching process may cause severe destruction, thus the surface of the reflective layer obtained goes against the plane orientation of the liquid crystal molecules. By employing this method, the viewing angle might be enlarged, but the orientation uniformity of the liquid crystal molecules could be decreased, so that the performances such as transmittance, contrast and dark-state uniformity are decreased.

SUMMARY

(I) Technical Problem to be Solved

The technical problem to be solved by the present invention is how to provide an array substrate and a method for preparing the same, and a display device, wherein the display viewing angle of the display device could be enlarged, and a decrease of the orientation uniformity of the liquid crystal molecules could be avoided as well.

(II) Technical Solution

In order to solve the above technical problem, the present invention provides an array substrate, which comprises a substrate, and a thin-film transistor and a passivation layer formed on a side of the substrate, that the array substrate is divided into a reflective region and a transmissive region; wherein an insulating layer is formed on the reflective region on a side of the passivation layer that is far from the substrate; and a nanoparticle layer for diffuse reflecting an incident light is formed on a side of the insulating layer that is far from the substrate.

Preferably, the nanoparticle layer comprises metal oxide nanoparticles.

Preferably, the metal oxide nanoparticles are at least one selected from titanium dioxide nanoparticle, aluminium oxide nanoparticle and zinc oxide nanoparticle.

Preferably, the insulating layer comprises a material of resin or silicon dioxide.

The present invention further provides a display device, which comprises the above array substrate.

The present invention further provides a method for preparing an array substrate which is divided into a reflective region and a transmissive region, the method comprises steps of:

forming a thin-film transistor and a passivation layer on a substrate;

forming an insulating layer on the reflective region of the passivation layer;

coating a photoresist doped with nanoparticles on the insulating layer; and exposing the photoresist to form a nanoparticle layer.

Preferably, the method further comprises: baking the substrate formed with the nanoparticle layer.

Preferably, the step of coating a photoresist doped with nanoparticles on the insulating layer comprises: sheltering the transmissive region of the passivation layer by a mask, and coating a photoresist doped with nanoparticles on the insulating layer.

Preferably, the nanoparticles are metal oxide nanoparticles; more preferably, the nanoparticles are at least one selected from titanium dioxide nanoparticle, aluminium oxide nanoparticle and zinc oxide nanoparticle.

Preferably, the insulating layer comprises a material of resin or silicon dioxide. The resin is not limited to epoxy resin, polyester resin, polyimide resin, phenolic resin, organic fluorine resin and organic silicon resin, etc.

(III) Beneficial Effects

The array substrate according to the embodiments of the present invention or the array substrate prepared according to the method of the present invention comprises a substrate, and a thin-film transistor and a passivation layer formed on a side of the substrate, and the array substrate is divided into a reflective region and a transmissive region, wherein an insulating layer is formed on the reflective region on a side of the passivation layer that is far from the substrate; and a nanoparticle layer for diffuse reflecting an incident light is formed on a side of the insulating layer that is far from the substrate. The nanoparticle layer has a uniform thickness, no uneven surface will be generated to influence the orientation uniformity of the liquid crystal molecules on the surface of the nanoparticle layer, therefore, not only the viewing angle of the array substrate is enlarged, but also the performances of the array substrate such as transmittance, contrast and dark-state uniformity are guaranteed, thus the present invention is especially applicable for display devices for large-scale outdoor display.

DETAILED DESCRIPTION

Specific embodiments of the present invention will be further described in detail below in conjunction with the drawings and examples, and the following examples are only used for illustrating the present invention, rather than limiting the scope of the present invention

Example 1

Figure 1:
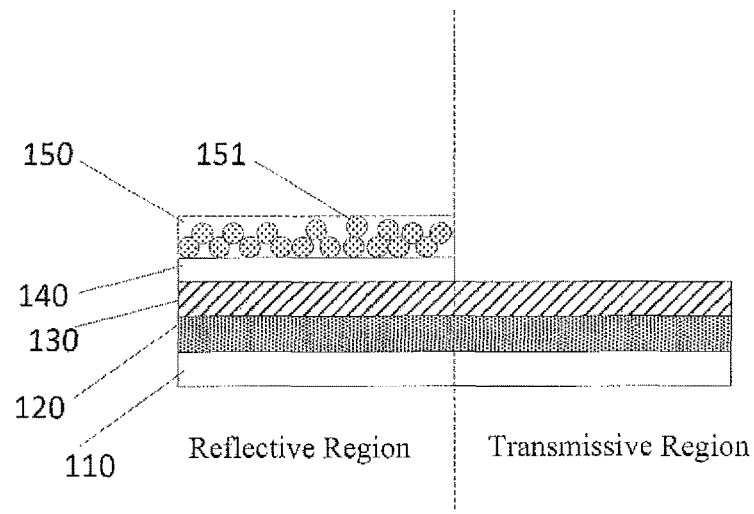
FIG. 1 is a structural schematic drawing of an array substrate according to example 1 of the present invention.

FIG. 1 is a structural representation of an array substrate according to example 1 of the present invention. As shown in FIG. 1, the array substrate includes a substrate 110, and a thin-film transistor (TFT) 120 and a passivation layer 13 that are formed on a side of the substrate 110, and the array substrate is divided into a reflective region and a transmissive region. In the reflective region, an insulating layer 140 is formed on a side of the passivation layer 130 that is far from the substrate 110, and a nanoparticle layer 150 for diffuse reflecting an incident light is formed on a side of the insulating layer 140 that is far from the substrate 110.

Specifically, the insulating layer 140 may comprise an insulating material such as resin and silicon dioxide. The advantages of setting the insulating layer 140 are as follows: on one hand, destruction of the circuit on the passivation layer 130 by the static electricity on the nanoparticle layer 150 can be avoided; on the other hand, the surface of the passivation layer 130 is generally uneven, which goes against the forming of the nanoparticle layer 150 with a uniform thickness; and by setting the insulating layer 140, a planar base may be provided for forming the nanoparticle layer 150, which is favorable to form the nanoparticle layer 150 with a uniform thickness.

The nanoparticle layer 150 comprises nanoparticles 151, which may be metal oxide nanoparticles, for example, at least one of titanium dioxide nanoparticle, aluminium oxide nanoparticle and zinc oxide nanoparticle.

The nanoparticles 151 are stacked on the surface of the insulating layer 140 to form the reflective regions with different radians, so that an incident light can be reflected at different angles, and as a result, an effect of enlarging the viewing angle can be attained. At the same time, the nanoparticles 151 are inorganic particles that can be well dispersed in a macromolecular material; thus the nanoparticle layer 150 obtained has a uniform thickness, and no uneven surface will be generated to influence the orientation uniformity of the liquid crystal molecules on the surface of the nanoparticle layer 150. Thus, by employing the array substrate of the present invention, not only the viewing angle is enlarged, but also the performances of the array substrate such as transmittance, contrast and dark-state uniformity can be guaranteed. Therefore, the array substrate of the present invention is applicable for large-scale outdoor display devices.

Example 2

This example provides a display device, which includes the array substrate according to example 1. The display device may be a small-scale display device for mobile phone, tablet computer and portable computer, etc.; or it may be a large-scale outdoor display device for plaza TV, open-air theater and large billboard, etc.

Example 3

Figure 2:
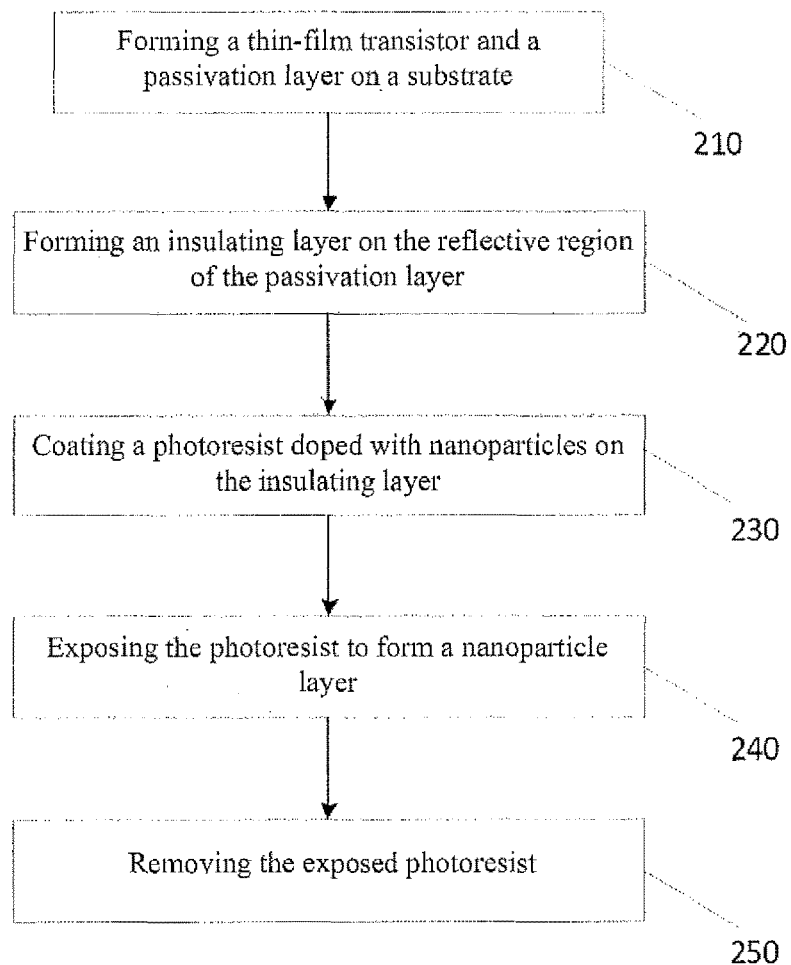
FIG. 2 is a flow chart of a method for preparing an array substrate according to example 3 of the present invention.

FIG. 2 is a flow chart of a method for preparing an array substrate according to example 3 of the present invention. FIGS. 3a to 3e are flow charts of a preparation process of an array substrate according to example 3 of the present invention. Referring to FIG. 2 and FIGS. 3a to 3e, the method includes the following steps.

210: Forming a thin-film transistor 120 and a passivation layer 130 on a substrate 110.

Figure 3A:
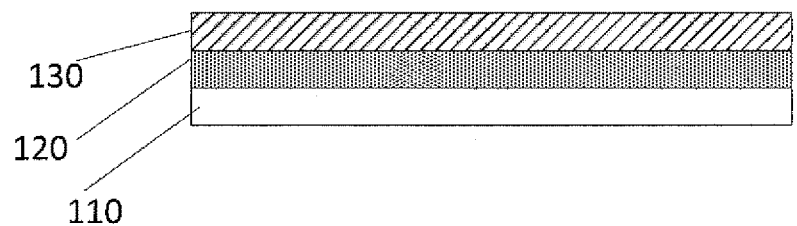
FIGS. 3a to 3e are flow charts of a preparation process of an array substrate according to example 3 of the present invention.

Specifically, the thin-film transistor 120 and the passivation layer 130 are formed in sequence on the substrate 110 according to an existing process, and it is unnecessary to go into details here. After the step 210, the structure as shown in FIG. 3a is obtained.

220: Forming an insulating layer 140 on the reflective region of the passivation layer 130.

Figure 3B:
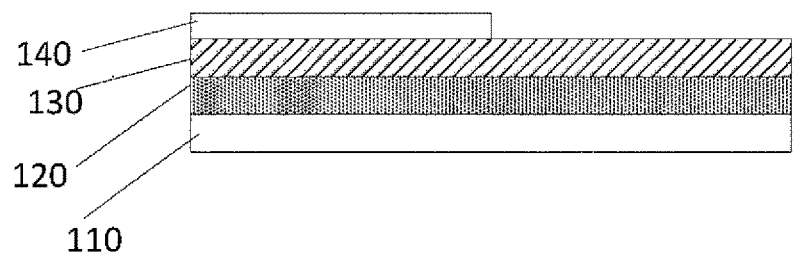

Specifically, the insulating layer 140 may comprise an insulating material such as resin or silicon dioxide. The advantages of setting the insulating layer 140 are as follows: on one hand, destruction of the circuit on the passivation layer 130 by the static electricity on the subsequent nanoparticle layer 150 can be avoided; on the other hand, the surface of the passivation layer 130 is generally uneven, which goes against the forming of the nanoparticle layer 150, but by setting the insulating layer 140, a planar base may be provided for forming the nanoparticle layer 150. The structure as shown in FIG. 3b is formed after the step 220.

230: Coating a photoresist 310 doped with the nanoparticles 151 on the insulating layer 140.

Figure 3C:
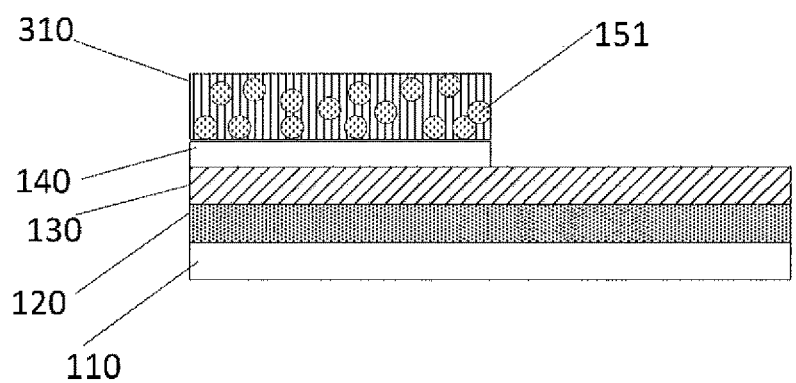

Specifically, this step may include: sheltering the transmissive region of the passivation layer 130 by a mask, and coating the photoresist 310 doped with the nanoparticles 151 on the insulating layer 140. After the step 230, the structure as shown in FIG. 3c is formed.

Here, the nanoparticles 151 may be metal oxide nanoparticles, for example, at least one of titanium dioxide nanoparticle, aluminium oxide nanoparticle and zinc oxide nanoparticle, and the nanoparticles 151 are dispersed in the photoresist 310 uniformly.

240: Exposing the photoresist 310 to form a nanoparticle layer 150.

Figure 3D:
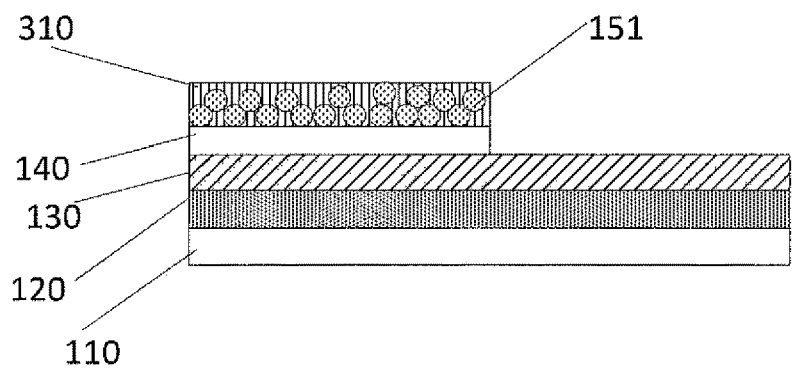

Specifically, by exposing the photoresist 310, the photoresist 310 may be removed partially, so that the nanoparticles 151 dispersed in the photoresist 310 may deposit on the insulating layer 140. After the step 240, the structure as shown in FIG. 3d is formed.

Additionally, the method may further include a step 250 after the step 240: removing the exposed photoresist 310.

Figure 3E:
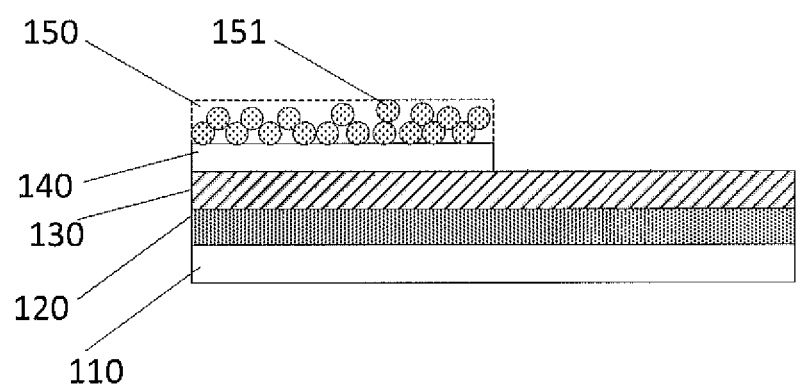

Specifically, the exposed photoresist 310 may be dissolved using a solvent. After the step 250, the structure as shown in FIG. 3e is formed.

In order to form the nanoparticle layer 150 on the insulating layer 140 rapidly and stably, the method may further include: baking the substrate 110 formed with the nanoparticle layer 150 after dissolving using the solvent.

For the array substrate obtained by the above preparation method, the nanoparticles 151 are stacked on the surface of the insulating layer 140 to form reflective regions with different radians, so that an incident light can be reflected at different angles, and as a result, an effect of enlarging the viewing angle can be attained. At the same time, the nanoparticles 151 are inorganic particles that can be well dispersed in a macromolecular material; thus the nanoparticle layer 150 obtained has a uniform thickness, and no uneven surface will be generated to influence the orientation uniformity of the liquid crystal molecules on the surface of the nanoparticle layer 150. Thus, by the array substrate of the present invention, not only the viewing angle may be enlarged, but also the performances of the array substrate such as transmittance, contrast and dark-state uniformity can be guaranteed. Therefore, the array substrate of the present invention is applicable for large-scale outdoor display devices.

The above examples are only used for illustrating the present invention, rather than limiting the present invention. Various modifications and variations may be made by one of ordinary skills in the art without departing from the spirit and scope of the present invention. Therefore, all equivalent technical solutions pertain to the scope of the present invention, and the protection scope of the present invention should be defined by the appended claims.

What is claimed is:

1. An array substrate, comprising a substrate, and a thin-film transistor and a passivation layer formed on a side of the substrate, that the array substrate is divided into a reflective region and a transmissive region, wherein
    an insulating layer is formed on the reflective region on a side of the passivation layer that is far from the substrate;
    a nanoparticle layer with a uniform thickness for diffuse reflecting an incident light is formed from metal oxide nanoparticles on a side of the insulating layer that is far from the substrate; and
    the metal oxide nanoparticles are stacked on the side of the insulating layer to form the reflective region with different radians, so that an incident light is reflected at different angles and then a viewing angle is enlarged.

2. The array substrate according to claim 1, wherein the metal oxide nanoparticles are at least one selected from titanium dioxide nanoparticle, aluminum oxide nanoparticle and zinc oxide nanoparticle.

3. The array substrate according to claim 1, wherein the insulating layer comprises a material of resin or silicon dioxide.

4. A display device, comprising the array substrate according to claim 1.

5. A method for preparing an array substrate which is divided into a reflective region and a transmissive region, the method comprising steps of:
    forming a thin-film transistor and a passivation layer on a substrate;
    forming an insulating layer on the reflective region on a side of the passivation layer that is far from the substrate; and
    forming a nanoparticle layer from metal oxide nanoparticles with a uniform thickness for diffuse reflecting an incident light on a side of the insulating layer that is far from the substrate, wherein the metal oxide nanoparticles are stacked on the side of the insulating layer to form the reflective region with different radians, so that an incident light is reflected at different angles and then a viewing angle is enlarged.

6. The method according to claim 5, wherein the step of forming a nanoparticle layer with a uniform thickness for diffuse reflecting an incident light on a side of the insulating layer that is far from the substrate comprises:
    coating a photoresist doped with nanoparticles on the insulating layer; and
    exposing the photoresist to form the nanoparticle layer.

7. The method according to claim 5, further comprising a step of removing the exposed photoresist.

8. The method according to claim 7, wherein the step of removing the exposed photoresist comprises dissolving the exposed photoresist using a solvent.

9. The method according to claim 8, further comprising: baking the substrate formed with the nanoparticle layer after dissolving using the solvent.

10. The method according to claim 6, wherein the step of coating a photoresist doped with nanoparticles on the insulating layer comprises: sheltering the transmissive region of the array substrate by a mask, and coating the photoresist doped with nanoparticles on the insulating layer.

11. The method according to claim 5, wherein the metal oxide nanoparticles are at least one selected from titanium dioxide nanoparticle, aluminum oxide nanoparticle and zinc oxide nanoparticle.

12. The method according to claim 5, wherein the insulating layer employs a material of resin or silicon dioxide.

* * * * *